United States Patent
Hudo et al.

(10) Patent No.: US 9,966,990 B1
(45) Date of Patent: May 8, 2018

(54) BINARY NYQUIST FOLDING RECEIVER

(71) Applicant: Raytheon Company, Waltham, MA (US)

(72) Inventors: Rafael J. Hudo, Waltham, MA (US); Roderick Newstrom, Waltham, MA (US)

(73) Assignee: Raytheon Company, Waltham, MA (US)

( * ) Notice: Subject to any disclaimer, the term of this patent is extended or adjusted under 35 U.S.C. 154(b) by 0 days. days.

(21) Appl. No.: 15/492,081

(22) Filed: Apr. 20, 2017

Related U.S. Application Data

(60) Provisional application No. 62/473,754, filed on Mar. 20, 2017.

(51) Int. Cl.
*H04B 1/10* (2006.01)
*H04B 1/7085* (2011.01)
*H03M 1/12* (2006.01)
*H04L 7/00* (2006.01)
*H04L 7/027* (2006.01)

(52) U.S. Cl.
CPC .......... *H04B 1/7085* (2013.01); *H03M 1/124* (2013.01); *H04L 7/0087* (2013.01); *H04B 2201/7073* (2013.01); *H04L 7/027* (2013.01)

(58) Field of Classification Search
CPC ........... H01Q 11/12; H03K 9/00; H03M 1/12; H03M 1/124; H03M 3/00; H04B 1/00; H04B 1/26; H04B 1/7085; H04B 15/00; H04L 7/00; H04L 7/0087; H04L 25/03038; H04L 27/00; H04L 27/06; H04L 27/2647

USPC ........ 341/143, 155; 375/130, 148, 260, 316, 375/340, 346, 350, 371; 455/113, 118, 455/139, 324

See application file for complete search history.

(56) References Cited

U.S. PATENT DOCUMENTS

| | | | |
|---|---|---|---|
| 6,266,518 B1 * | 7/2001 | Sorrells | H03C 1/62 455/113 |
| 7,110,732 B2 * | 9/2006 | Mostafa | H04B 1/0003 375/240.21 |
| 7,436,910 B2 | 10/2008 | Fudge et al. | |
| 7,436,911 B2 | 10/2008 | Fudge et al. | |

(Continued)

FOREIGN PATENT DOCUMENTS

WO 2007047248 4/2007

*Primary Examiner* — Shawkat M Ali
(74) *Attorney, Agent, or Firm* — Burns & Levinson, LLP; Joseph M. Maraia

(57) ABSTRACT

A signal receiver divides frequency conversion into multiple steps based on a $Log_2(N)$ number corresponding to the number N of Nyquist zones that are to be covered. This binary structure used Track and Hold (T/H) amplifiers as samplers for wideband frequency conversion where the frequency coverage is defined by a number of cascaded segments. The receiver system includes a plurality of conversion stages coupled in series with one another. Each conversion stage includes a bandpass filter at its input node with a T/H amplifier configured to receive a respective T/H clock signal. Each conversion stage is either bypassed or implemented depending on the frequency bandwidth being processed. Each bandpass filter is configured to have a respective bandwidth range that differs from the bandwidth range of the other bandpass filters. Each T/H amplifier is configured to receive a respective T/H clock input signal.

19 Claims, 9 Drawing Sheets

(56) References Cited

U.S. PATENT DOCUMENTS

| | | | |
|---|---|---|---|
| 7,436,912 B2 | 10/2008 | Fudge et al. | |
| 7,489,745 B2 | 2/2009 | Fudge | |
| 7,496,158 B2 | 2/2009 | Fudge et al. | |
| 8,212,699 B1 * | 7/2012 | Nilsson | H03M 3/348 341/143 |
| 8,325,865 B1 * | 12/2012 | Rofougaran | H04B 1/001 375/316 |
| 8,509,368 B2 * | 8/2013 | Fudge | H04B 1/28 375/130 |
| 8,953,715 B1 * | 2/2015 | Haddadin | H04B 1/0025 375/316 |
| 2007/0025478 A1 * | 2/2007 | Koga | H04B 7/0817 375/345 |
| 2007/0285296 A1 * | 12/2007 | Bilhan | H03M 1/0629 341/155 |

* cited by examiner

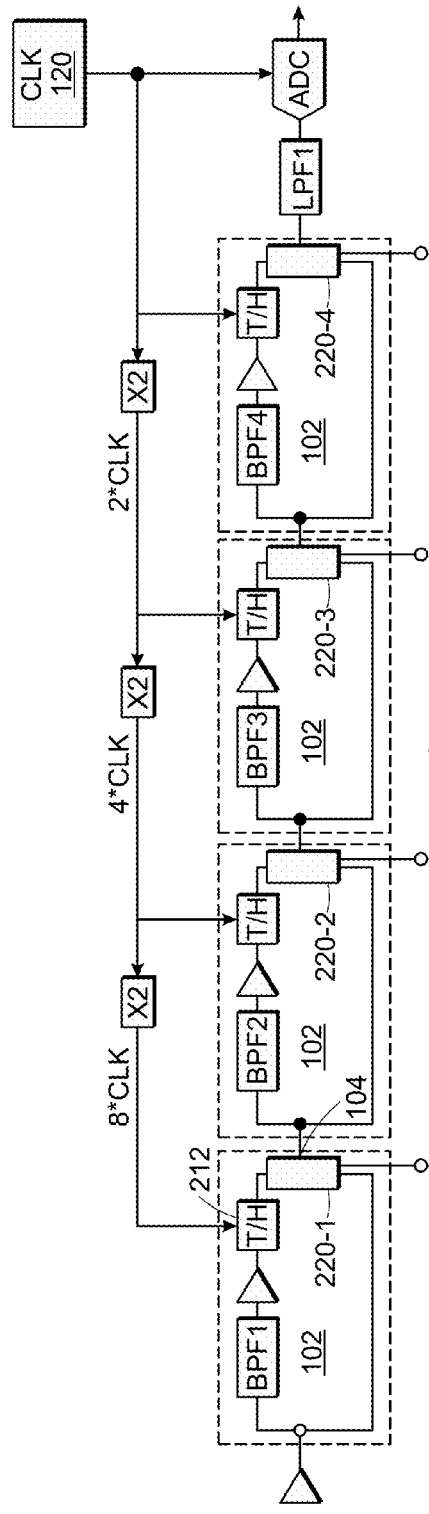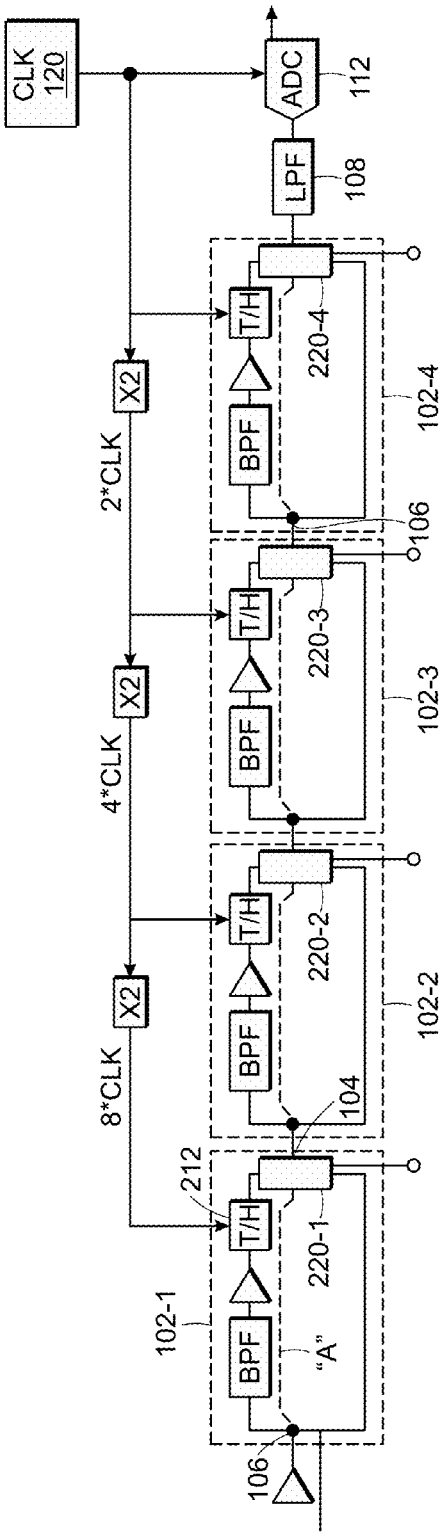

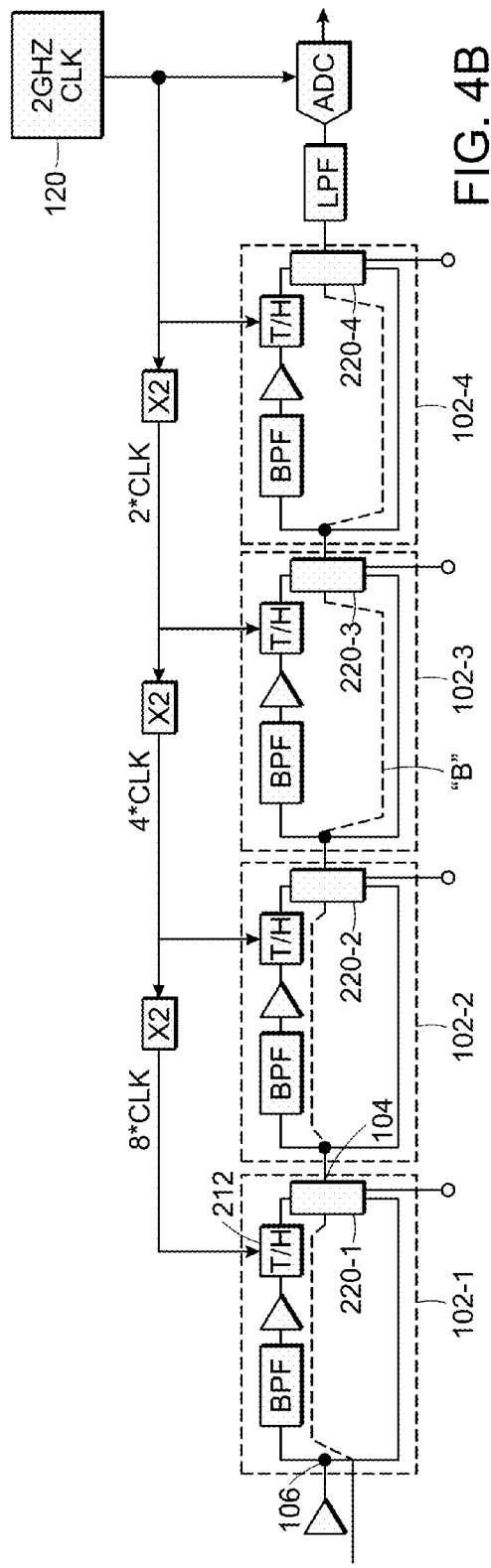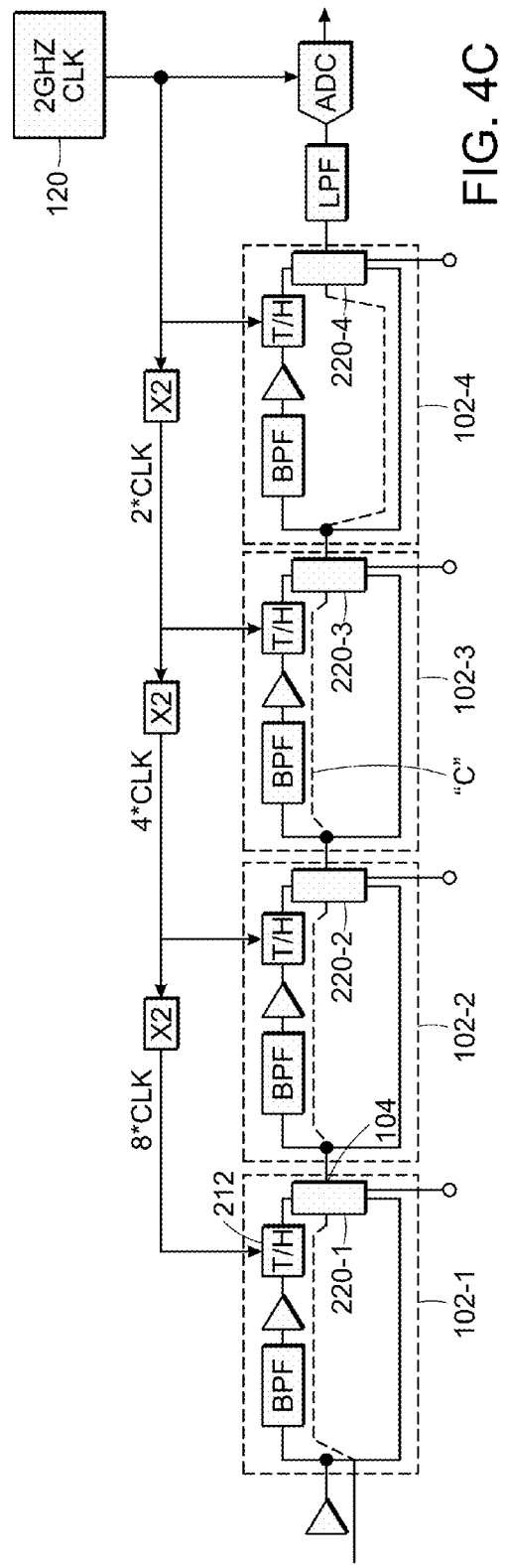

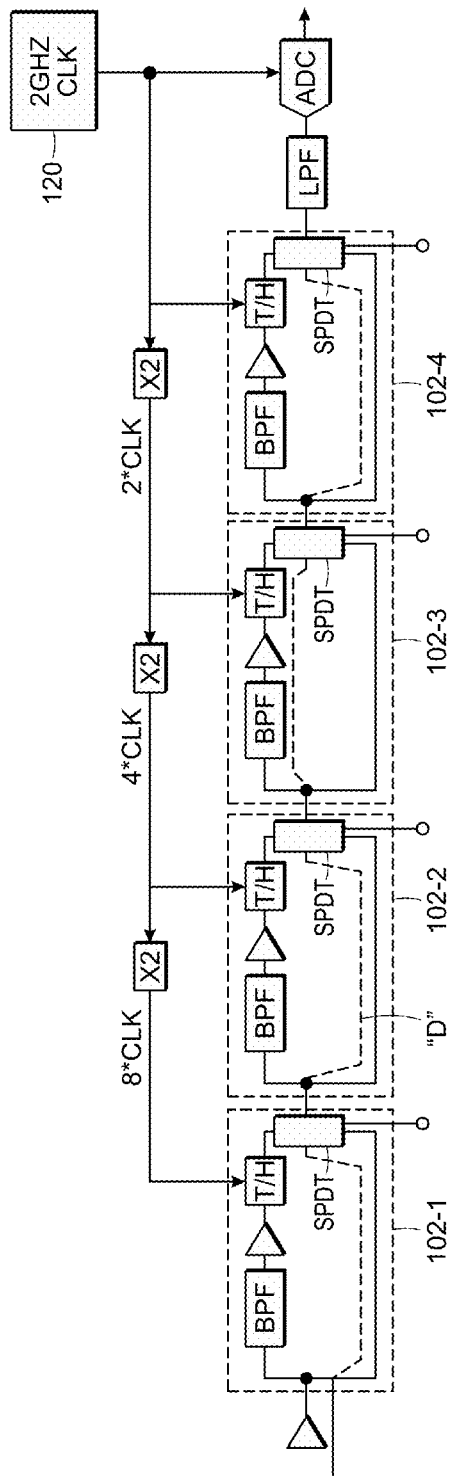
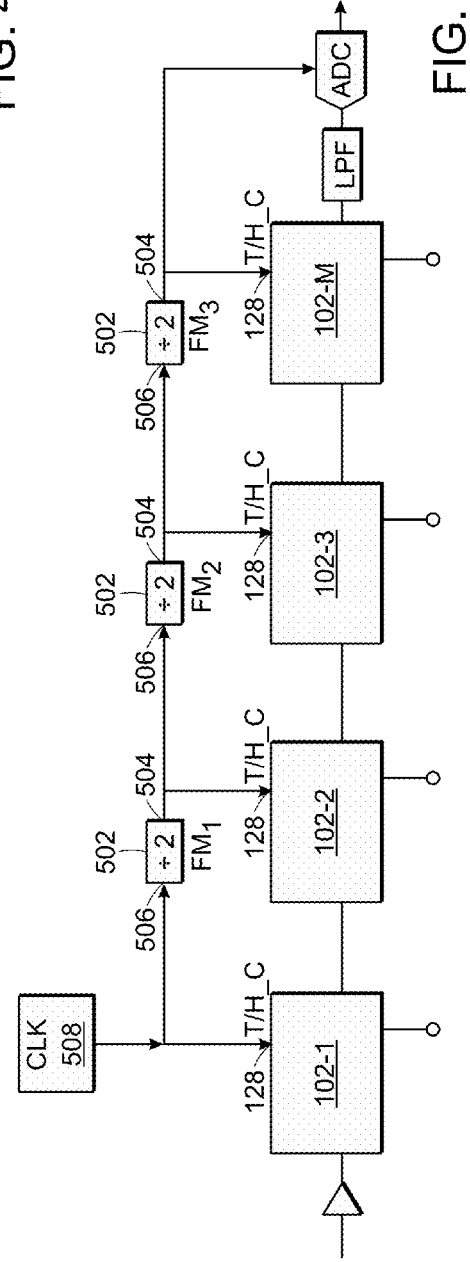
FIG. 4D
FIG. 5

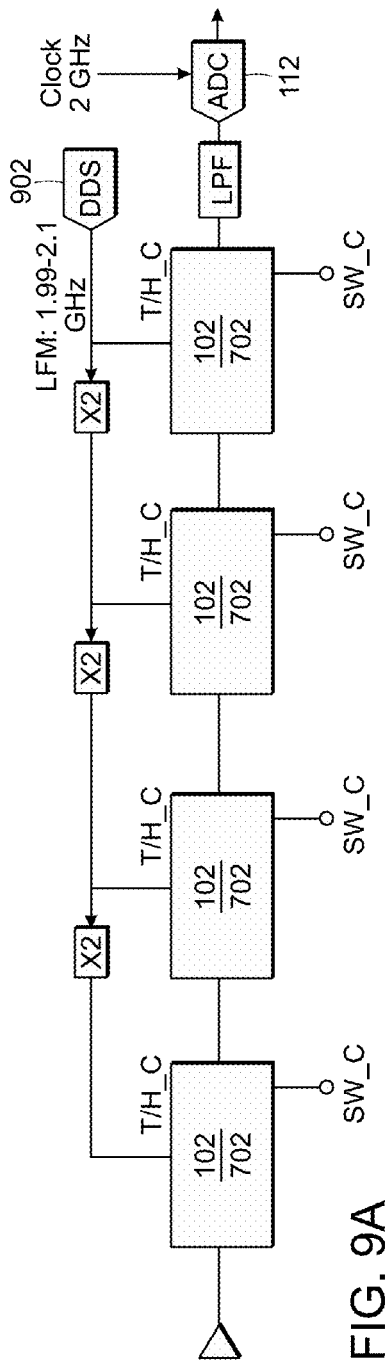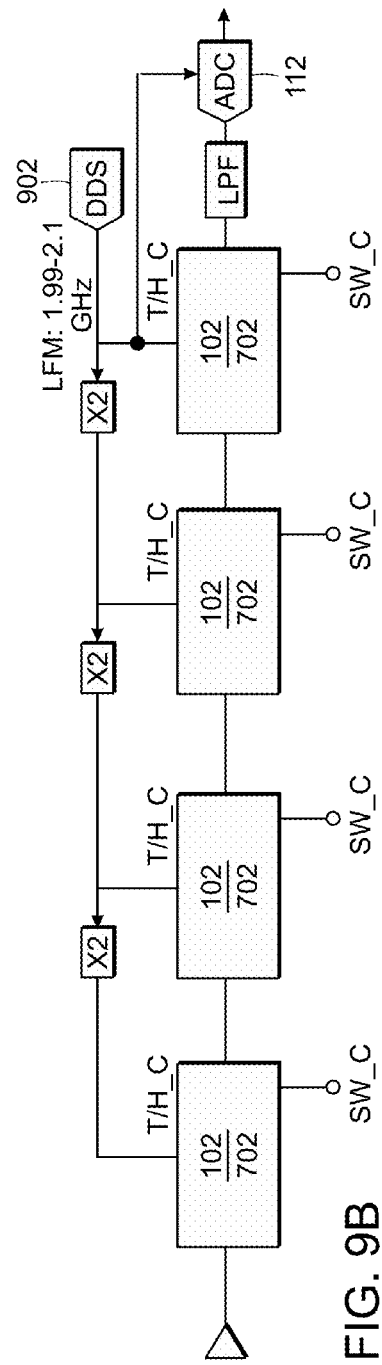

BINARY NYQUIST FOLDING RECEIVER

CROSS-REFERENCE TO RELATED APPLICATIONS

This application claims priority to and benefit of U.S. Application No. 62/473,754, filed on Mar. 20, 2017, entitled BINARY NYQUIST FOLDING RECEIVER, which is incorporated herein in its entirety for all purposes.

BACKGROUND OF THE INVENTION

RF receivers with increased coverage of the RF spectrum are necessary in order to meet ever increasing mission capabilities. Known RF receiver systems use a large number of pre-selection filters and ultra-wideband local oscillators (LO) to achieve a wide RF spectrum coverage. Current approaches also rely on a Zero-IF receiver architecture with a VCO/PLL to cover the larger RF spectrum range at the expense of limited IBW (<200 MHz). Multiple LO tones separated by the IBW to achieve wideband coverage are required Frequency conversion through a mixer is limited in spectrum coverage due to balun designs. Either the RF/LO ports are limited or the IF port is limited in BW as the IF BW of track-and-hold amplifiers is broadband and covers up-to the 1st Nyquist null frequency.

Other known approaches utilize multiple Nyquist zones folding to cover the desired RF spectrum but suffer from low sensitivity due to the large number of aliases and require signal processing to determine the actual frequency of the signals of interest.

Complex LO generation and the large number of RF pre-selection filters, however, require a large amount of space, weight and power to accommodate them in a design. What is needed is a receiver architecture that does not need large filter banks and avoids complex LO generation but still obtains ultra-wideband RF spectrum coverage.

BRIEF SUMMARY OF THE INVENTION

In one aspect of the present disclosure, a receiver for processing an input signal comprises: a plurality of M conversion stages R coupled in series such that an output node of each of the conversion stages $R_x$, where x=1 to M−1, is coupled to an input node of the conversion stage $R_{x+1}$; a low pass filter having an input node coupled to the output node of the conversion stage $R_M$; and an analog-to-digital converter (ADC) having an input node coupled to an output node of the low pass filter, the ADC having an operating clock node configured to receive an ADC clock signal. Each of the conversion stages $R_x$ comprises: a bandpass filter having an input node coupled to the respective conversion stage input node; a track and hold (T/H) circuit having an input node coupled to an output node of the bandpass filter and a T/H clock input node configured to receive a respective T/H clock signal; and a switch configured to couple one of: 1) an output node of the respective T/H module or 2) the respective input node of the conversion stage, to the output node of the conversion stage. Each bandpass filter is configured to have a respective bandwidth range that differs from the bandwidth range of the other bandpass filters, and each T/H module is configured to receive a respective T/H clock input signal.

In another aspect, a plurality of (M−1) frequency multipliers is coupled in series such that an output node of the frequency multiplier $FM_{A+1}$, where A=1 to (M−2), is coupled to an input node of the frequency multiplier $FM_{A+1}$, each frequency multiplier configured to multiply an input signal by a value P. An input node of the conversion stage $R_M$ and an input node of the frequency multiplier $FM_1$ are configured to receive the ADC clock signal, and each T/H clock input node of the conversion stages $R_x$, where x=(M−1) to 1, step −1, is coupled to the respective output node of the frequency multiplier $FM_A$, where A=1 to (M−1).

BRIEF DESCRIPTION OF THE DRAWINGS

Various aspects of at least one embodiment of the present invention are discussed below with reference to the accompanying figures. It will be appreciated that for simplicity and clarity of illustration, elements shown in the drawings have not necessarily been drawn accurately or to scale. For example, the dimensions of some of the elements may be exaggerated relative to other elements for clarity or several physical components may be included in one functional block or element. Further, where considered appropriate, reference numerals may be repeated among the drawings to indicate corresponding or analogous elements. For purposes of clarity, not every component may be labeled in every drawing. The figures are provided for the purposes of illustration and explanation and are not intended as a definition of the limits of the invention. In the figures:

FIG. 3 is a block diagram of a receiver system having a plurality of conversion stages in accordance with an aspect of the disclosure FIGS. 4A-4D are operating configurations of the system of FIGS. 1 and 3 in accordance with aspects of the present disclosure;

FIG. 5 is a block diagram of a receiver system in accordance with an aspect of the disclosure;

FIGS. 9A and 9B are block diagrams of receiver systems in accordance with aspects of the disclosure.

DETAILED DESCRIPTION

Figure 1:
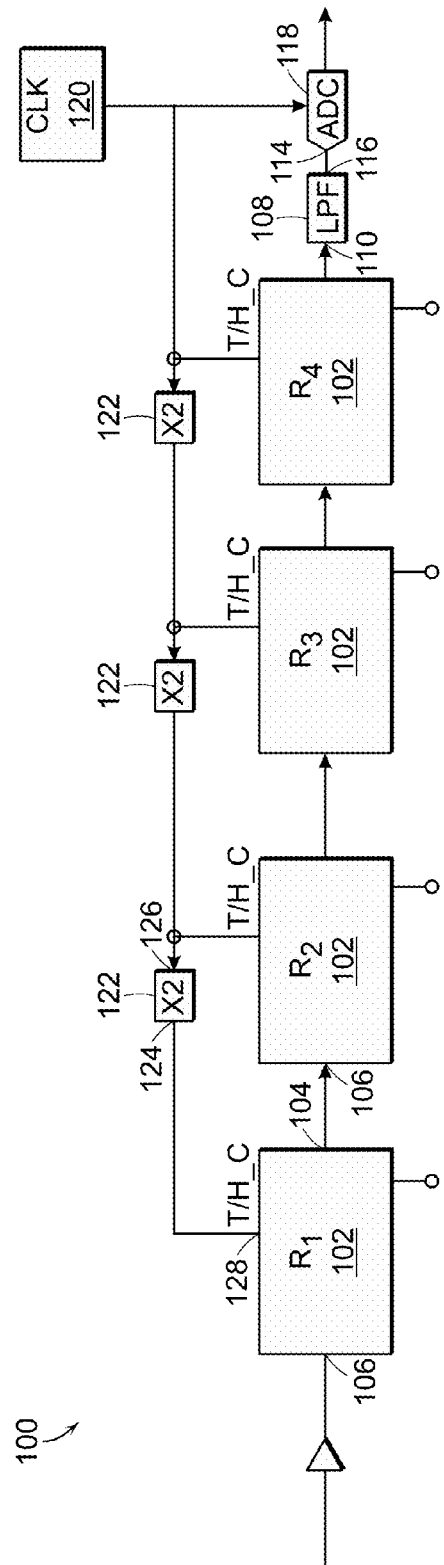
FIG. 1 is a block diagram of a receiver system having a plurality of conversion stages in accordance with an aspect of the disclosure.

This application claims priority to and benefit of U.S. Application No. 62/473,754, filed on Mar. 20, 2017, entitled BINARY NYQUIST FOLDING RECEIVER, which is incorporated herein in its entirety for all purposes.

In the following detailed description, numerous specific details are set forth in order to provide a thorough understanding of the embodiments of the present disclosure. It will be understood by those of ordinary skill in the art that these embodiments may be practiced without some of these specific details. In other instances, well-known methods, procedures, components and structures may not have been described in detail so as not to obscure the described embodiments.

Prior to explaining at least one embodiment in detail, it is to be understood that these are not limited in their application to the details of construction and the arrangement of the components set forth in the following description or illustrated in the drawings. Also, it is to be understood that the phraseology and terminology employed herein are for the purpose of description only and should not be regarded as limiting.

Advantageously, a proposed receiver architecture can be implemented that is compact in size and weight, and has reduced power needs, by dividing the frequency conversion into multiple steps that minimize the number of RF pre-select filters that are needed, i.e., more conversion using fewer filters.

Conversion is based on a $Log_2(N)$ number corresponding to the number N of Nyquist zones that are to be covered. This binary structure simplifies the local oscillator (LO) requirements to be fixed LOs that are derived from an analog-to-digital (ADC) clock signal that defines the Nyquist zone, as described below. That is, a single clock source ADC sampling rate. Further, modulating the LO provides a capability for compress sensing and thus added discrimination of aliased signals which can be used to cover blind spots in the received signal.

The factor of two structure of frequency conversion allows for a minimal number of pre-selection filters thus reducing SWaPs as well as allowing for a simplified LO structure based on a single source and limited to ADC clock speed. In one aspect, the respective LO signals for frequency conversions are derived by doubling the ADC clock for every conversion required.

As will be described in more detail below, Track and Hold (T/H) amplifiers are used as samplers for wideband frequency conversion where the frequency coverage is defined by a number of cascaded segments. Continuous frequency conversion for wideband applications from DC up to a desired max frequency is possible. Compressed sensing techniques are leveraged through the use of the single LO for discrimination of aliases and possible leakages allowing continuous frequency coverage with a minimal number of pre-selected filters and associated hardware.

Referring now to FIG. 1, in one aspect of the present disclosure, a receiver system 100 includes a plurality of M conversion stages (R) 102, coupled in series with one another such that an output node 104 of a conversion stage $R_x$, where x=1 to M−1, is coupled to an input node 106 of the conversion stage $R_{x+1}$. A low pass filter 108 has an input node 110 coupled to the output node 104 of the $M^{th}$ conversion stage. An analog-to-digital converter (ADC) 112 has an input node 114 coupled to an output node 116 of the low pass filter 108. The ADC 112 has an operating clock node 118 configured to receive an ADC clock signal from a local oscillator (LO) 120.

A plurality of (M−1) frequency multipliers (FM) 122 are coupled in series such that an output node 124 of the frequency multiplier $FM_A$, where A=1 to (M−2), is coupled to an input node 126 of the frequency multiplier $FM_{A+1}$. Each frequency multiplier 122 is configured to multiply an input signal by a value P. A T/H clock input node 128 of the conversion stage $R_M$ and the input node 126 of the frequency multiplier $FM_1$ are configured to receive the ADC clock signal from the LO 120. Each T/H clock input node 128 of the conversion stages 102 $R_x$, where x=(M−1) to 1, step −1, is coupled to the respective output node 124 of the frequency multiplier $FM_A$, where A=1 to (M−1).

Figure 2A:
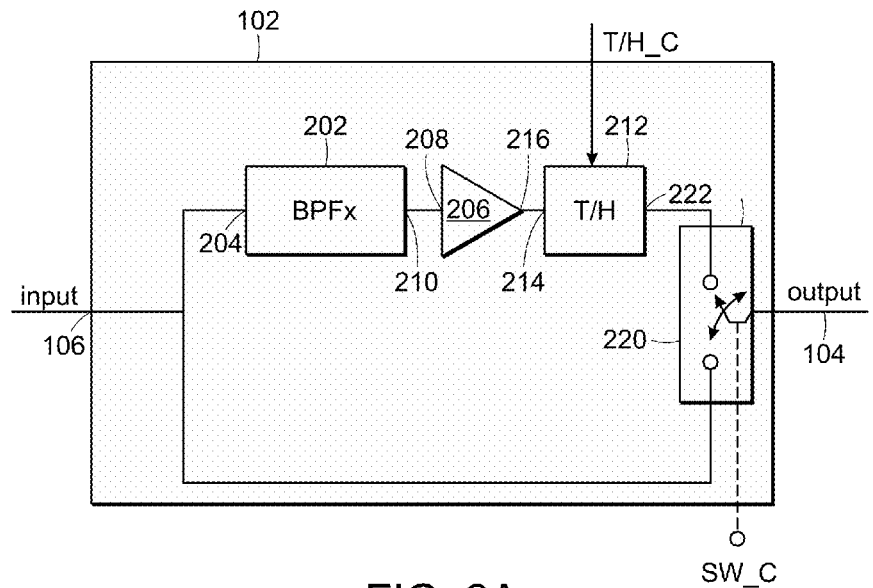
FIGS. 2A, 2B are block diagrams of various conversion stages in accordance with aspects of the disclosure.

In one aspect, each of the conversion stages 102, referring to FIG. 2A, includes a bandpass filter 202 having an input node 204 coupled to the respective conversion stage input node 106. An amplifier 206 has an input node 208 coupled to an output node 210 of the bandpass filter 202. A track and hold (T/H) amplifier 212 has an input node 214 coupled to the output node 216 of the amplifier 206 and a T/H clock input node 218 configured to receive a respective T/H clock signal. An output switch 220, for example, of single-pole-double-throw construction, is configured to couple one of: an output node 222 of the respective T/H amplifier 212 or the respective input node 106 of the conversion stage 102, to the output node 104 of the conversion stage 102. Each bandpass filter 202 is configured to have a respective bandwidth range that differs from the bandwidth range of the other bandpass filters 202. A signal line SW_C controls the setting of the output switch 220.

Figure 2B:
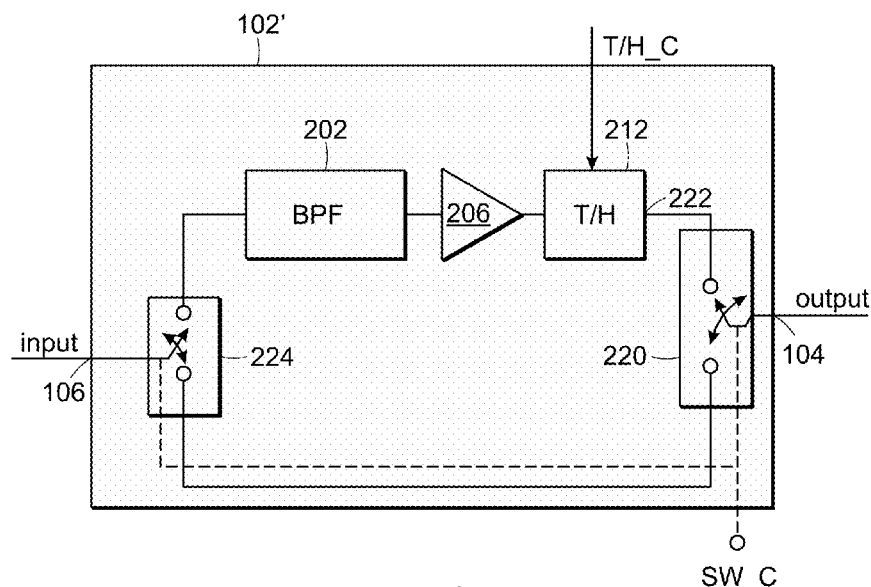

In another aspect, an alternate conversion stages 102', referring to FIG. 2B, is modified to have an input switch 224, for example, of single-pole-double-throw construction, coupled to the respective conversion stage input node 106. The input switch 224 is configured to couple the input node 106 of the conversion stage 102' to the input node 204 of the bandpass filter 202 or to the output switch 220. The output switch 220 and the input switch 224 may be controlled by the same signal line SW_C.

In an non-limiting example, the input and output switches 224, 220 may each be implemented with a GaAs MMIC SPDT Non-Reflective switches available from Hittite Microwave Corporation of Chelmsford, Mass. The amplifier 208 may be implemented with a GaAs pHEMT MMIC Low-Noise Amplifier, also available from Hittite. The T/H amplifier 212 may be implemented with an Ultra-Wideband 4 GS/s Track-And-Hold Amplifier (DC-18 GHz) that is also available from Hittite.

The connections of the conversion stages, with the conversion stages of FIG. 2A, is presented in FIG. 3.

In operation, the respective bandwidth range of each of the conversion stages is set. In one example, referring to FIGS. 4A-4D, where input signals in the DC to 16 GHz range are being processed, an ADC input clock signal of 2 GHz is chosen. The first conversion stage 102-1 has a bandpass filter with a range of 8-16 GHZ, the second stage 102-2 has a range of 4-8 GHZ, the third stage 102-3 has a range of 2-4 GHz and the fourth ($M^{th}$) stage 102-4 has a range of 1-2 GHz. The low pass filter 108 is set to pass signals in a range of DC to 1 GHz. As can be seen, the ADC input signal is at least twice the highest frequency coming from the low pass filter 108.

Further, for a particular bandwidth of interest, e.g., a sub-band of the DC-16 GHz band, each output switch 220 of each conversion stage 102 is set to either couple the output node 104 directly to the input node 106 or to the output of the T/H amplifier 212. For example, referring to FIG. 4A, if the signal of interest is in the 10-11 GHz range, then all of the output switches 220-1 to 220-4 are set to couple to the output node of the respective T/H amplifier 212, resulting in a signal path as indicated by the dotted line "A" representing the path the signal takes.

If, for example, the input signal of interest is in the 8-9 GHz range, then the output switches 220-1, 220-2 of the first and second conversion stages 102-1, 102-2 are set to couple the output of the respective T/H amplifiers 212 to the respective output node 104 while the third and fourth conversion stages 102-3, 102-4 are set to couple the respective input node 106 to the respective output node 104, as shown in FIG. 4B and resulting in a signal path represented by the dotted line "B."

Referring now to FIG. 4C, if the input signal of interest is in the 4-5 GHz range, then the output switches 220-1, 220-2, 220-3 of the first, second and third conversion stages 102-1, 102-2, 102-3 are set to couple the output of the respective T/H amplifier 212 to the respective output node 104 while the fourth ($M^{th}$) conversion stage 102-4 is set to couple the respective input node 106 to the respective output node 104, as shown in FIG. 4C and resulting in a signal path represented by the dotted line "C."

If the input signal of interest is in the 3-4 GHz range, then the output switches 220-1, 220-2, 220-3 of the first, second and fourth ($M^{th}$) conversion stages 102-1, 102-2, 102-4 are set to couple the respective input nodes to the respective output node while the third conversion stage 102-3 is set to couple the respective output nodes of the T/H amplifier 212 to the respective output node 104 of the conversion stage, as shown in FIG. 4D and resulting in a signal path represented by the dotted line "D."

As presented in FIGS. 1-4D, the multipliers 122 are configured to provide a clock signal to each conversion stage 102, i.e., to the respective T/H amplifier 212 of each stage 102. In the example shown, each multiplier 122 is a 2× multiplier. Advantageously, only one local oscillator (LO) 120 is required to drive the system.

In an alternate approach, referring now to FIG. 5, a plurality of (M−1), where M=4, frequency multipliers 502 (FM) are coupled in series to one another such that an output node 504 of the frequency multiplier $FM_A$, where A=1 to (M−2), is coupled to an input node 506 of the frequency multiplier $FM_{A+1}$. Each frequency multiplier 502 is configured to multiply an input signal by a value P. The T/H clock input node 128 of the conversion stage 102-1 $R_1$ and the input node 506 of the frequency multiplier $FM_1$ are configured to receive a master clock signal MC from a master clock LO 508. Further, each T/H clock input node 128 of the conversion stage 102 ($R_x$), where x=2 to M, is coupled to the respective output node 504 of the frequency multiplier $FM_A$, where A=1 to (M−1). Here, the multiplication value P=0.5. Thus, the master clock signal MC is "stepped-down" for each conversion stage 102, however, only a single LO 508 is needed for the system.

Figure 6:
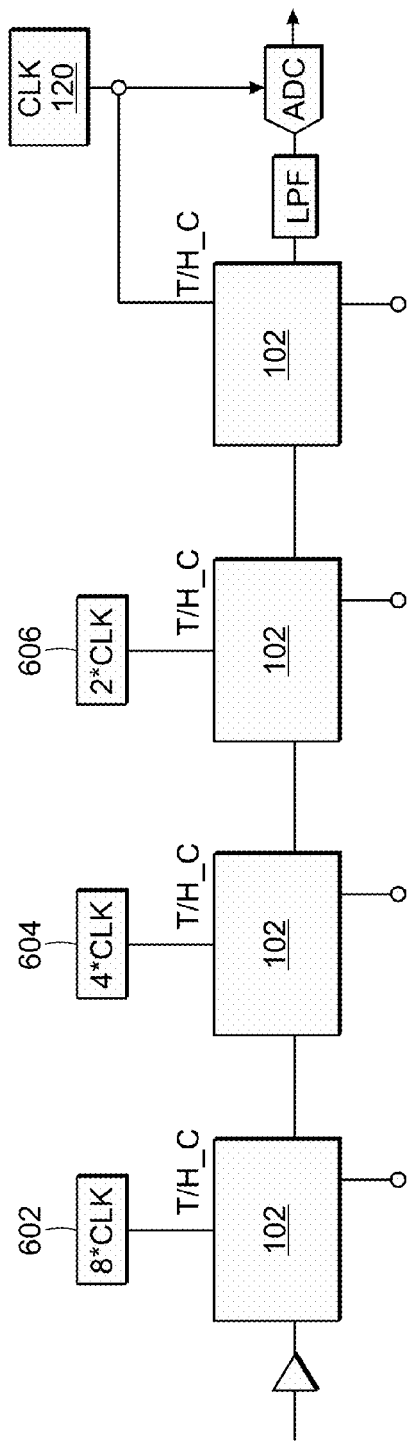
FIG. 6 is a block diagram of a receiver system in accordance with an aspect of the disclosure.

In another aspect of the disclosure, each conversion stage 102 receives a respective T/H clock input signal from a respective signal source 602, 604, 606, as shown in FIG. 6.

Figure 7:
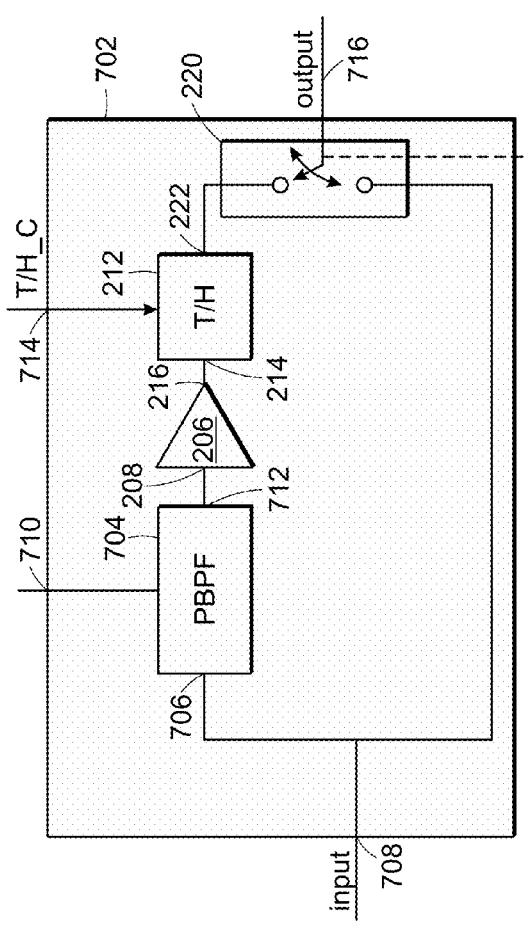
FIG. 7 is a block diagrams of a conversion stage in accordance with an aspect of the disclosure.

Referring now to FIG. 7, in another aspect of the present disclosure, a conversion stage 702 includes a programmable bandpass filter (PBPF) 704 having an input node 706 coupled to the respective conversion stage input node 708 and a filter setting node 710 to receive a filter setting signal. An amplifier 206 has an input node 208 coupled to an output node 712 of the programmable bandpass filter 704. A track and hold (T/H) amplifier 212 has an input node 214 coupled to the output node 216 of the amplifier 206 and a T/H clock input node 714 configured to receive a respective T/H clock signal. An output switch 220 is configured to couple one of: an output node 222 of the respective T/H amplifier 212 or the respective input node 708 of the conversion stage 702, to the output node 716 of the conversion stage 702. Each programmable bandpass filter 704 can be set to have a respective bandwidth range that differs from the bandwidth range of the other programmable bandpass filters 704.

Figure 8:
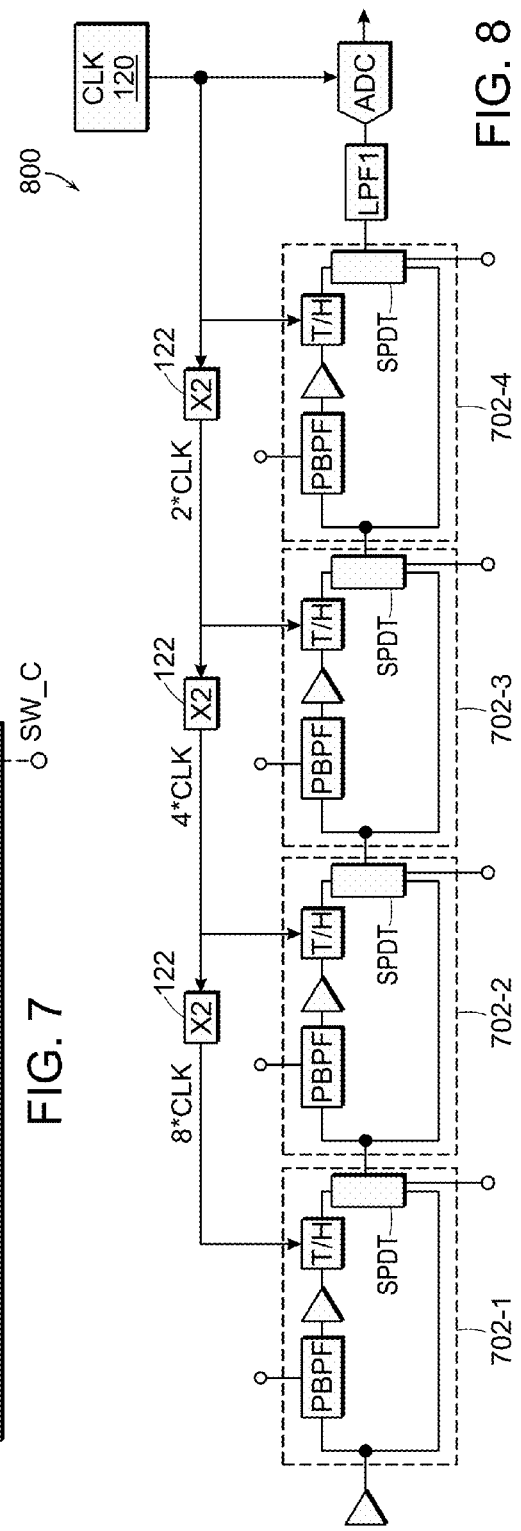
FIG. 8 is a block diagram of a receiver system having a plurality of conversion stages as shown in FIG. 7 in accordance with an aspect of the disclosure.

Advantageously, each conversion stage 702 is the same and its respective PBPF 704 range value can be set according to the system requirements. A system 800 as shown in FIG. 8 would operate in the same manner as that described above for the system in FIGS. 1-4D. In addition, one of ordinary skill in the art will understand how the system 800 of FIG. 8 can be modified to use the multipliers 502 of FIG. 5, the multiple oscillators 602, 604, 604 of FIG. 6 or to incorporate the input switch 224 into each conversion stage 702.

In some instances, it may be advantageous to modify the frequency of the clock signal provided to the conversion stages 102, 702. Accordingly, in one aspect as shown in FIG. 9A, a variable Direct Digital Synthesizer (DDS) 902 is provided as the signal source to drive the conversion stages 102, 702. Generally, the DDS 802 is configured to provide a signal with a frequency range that is centered about the frequency of the signal used to the clock the ADC 112. Thus, in the example, with a 2 GHZ signal driving the ADC 112, the DDS 902 may be configured to output a signal from 1.9-2.1 GHZ. Of course, the DDS 902 need not be centered on the clock frequency of the ADC 112 and could be asymmetrically defined about that frequency as well.

In yet another aspect, all clock signals may be generated from the DDS 902, as shown in FIG. 9B. One of ordinary skill in the art will understand that the ADC 112 would have to be chosen to be one that is able to function with a variable clock signal, i.e., it does not require a reset each time the sampling clock frequency is changed.

Figure 10:
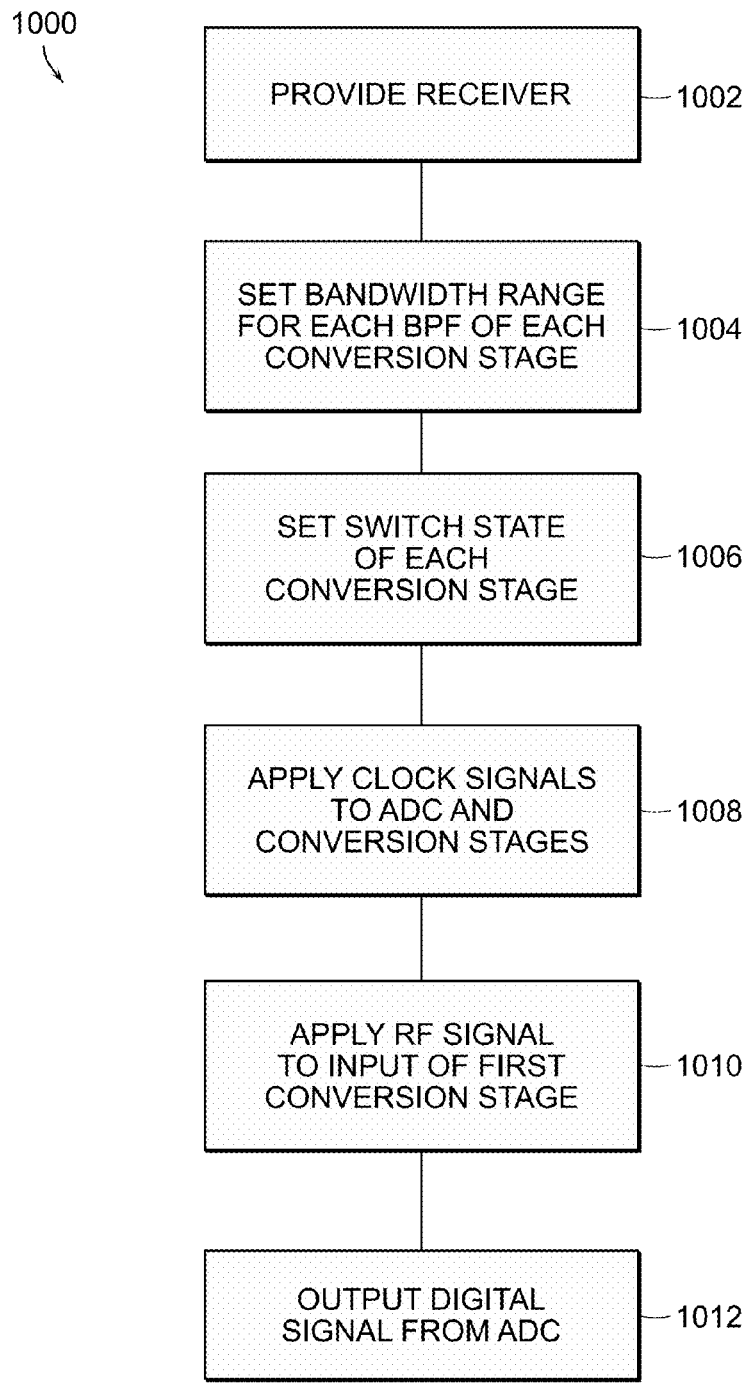
FIG. 10 is a method of operation of a receiver system in accordance with an aspect of the disclosure.

A method 1000 of processing an input signal, referring now to FIG. 10 includes providing a receiver as outlined above 1002 and configuring 1004 a respective bandwidth range of each bandpass filter to a range of values that differs from the bandwidth range of the other bandpass filters. The switch of each conversion stage is then set 1006 to couple the output node to either one of: 1) an output node of the respective T/H module or 2) the respective input node of the conversion stage. The method include providing 1008 the ADC clock signal to the ADC and providing a different frequency T/H clock signal to each conversion stage as a function of a frequency of the ADC clock signal. The input signal is provided 1010 to the conversion stage $R_1$ and a digital representation of the input signal is output 1012 from the ADC.

Aspects of the present disclosure include an architecture that provides a sub-banded ultra-wideband RF spectrum coverage while minimizing the number of RF pre-select filters that are needed. Thus, the requirement for the filters is simplified in that there is no need for an ultra-wideband LO. This leads to a scalable frequency conversion plan that optimizes size, weight and power.

The present system is not blind to multiples of $F_s/2$ as this is resolved by using compressed sensing techniques where the alias can be allowed to fold in. The Track and Hold sampling ($F_s$) is then modulated and used to resolve ambiguity between in-band and aliased signal, i.e., compressed sensing. The system provides continuous coverage with no Nyquist nulls.

A Nyquist null is a region where reception is hindered by aliasing of out-of-band energy on a sampled system. Modulating the T/H LOs modulates the signals incident to the T/H by some BW (modulation BW). The modulation BW will have a predictable and distinctive effect on the in-band signals as well as out-of-band aliased signals which is exploited to discriminate between the two.

Above, an exemplary system provided efficient wideband coverage as only five filters and four T/H amplifiers are necessary to cover DC-16 GHz with a single LO multiplied or divided to generate all clock signals.

Various embodiments of the above-described systems and methods may be implemented in analog circuitry, digital electronic circuitry, "hybrid" analog/digital circuitry, in connection with computer hardware, firmware, and/or software.

The above-described embodiments may be implemented as a dedicated hardware solution such as in an application specific integrated circuit (ASIC) or via any other custom hardware implementation.

A computer program product, i.e., a computer program tangibly embodied in an information carrier, can be included, to control the operation of, e.g., data processing apparatus, i.e., a computer and its necessary components. The implementation can include, for example, a programmable processor, a computer, and/or multiple computers.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable sub-combination.

Whereas many alterations and modifications of the disclosure will no doubt become apparent to a person of ordinary skill in the art after having read the foregoing description, it is to be understood that the particular embodiments shown and described by way of illustration are in no way intended to be considered limiting. Further, the subject matter has been described with reference to particular embodiments, but variations within the spirit and scope of the disclosure will occur to those skilled in the art. It is noted that the foregoing examples have been provided merely for the purpose of explanation and are in no way to be construed as limiting of the present disclosure.

Although the present disclosure has been described herein with reference to particular means, materials and embodiments, the present disclosure is not intended to be limited to the particulars disclosed herein; rather, the present disclosure extends to all functionally equivalent structures, methods and uses, such as are within the scope of the appended claims.

The invention claimed is:

1. A receiver for processing an input signal, comprising:
   a plurality of M conversion stages R coupled in series such that an output node of each of the conversion stages $R_x$, where x=1 to M−1, is coupled to an input node of the conversion stage $R_{x+1}$;
   a low pass filter having an input node coupled to the output node of the conversion stage $R_M$; and
   an analog-to-digital converter (ADC) having an input node coupled to an output node of the low pass filter, the ADC having an operating clock node configured to receive an ADC clock signal,
   wherein each of the conversion stages $R_x$ comprises:
   a bandpass filter having an input node coupled to the respective conversion stage input node;
   a track and hold (T/H) circuit having an input node coupled to an output node of the bandpass filter and a T/H clock input node configured to receive a respective T/H clock input signal; and
   a switch alternately configurable to couple the output node of the conversion stage to one of: 1) an output node of the respective T/H module circuit or 2) the respective input node of the conversion stage,
   wherein the bandpass filter is configured to have a respective bandwidth range that differs from each of the bandwidth ranges of the other bandpass filters of the plurality of conversion stages, and
   wherein the T/H circuit is configured to receive a respective T/H clock input signal that is different from a T/H clock input signal received at each of the other T/H circuits of the plurality of conversion stages.

2. The receiver of claim 1, further comprising:
   a plurality of (M−1) frequency multipliers coupled in series such that an output node of the frequency multiplier $FM_A$, where A=1 to (M−2), is coupled to an input node of the frequency multiplier $FM_{A+1}$, each frequency multiplier configured to multiply an input signal by a value P,
   wherein the T/H clock input node of the conversion stage $R_M$ and an input node of the frequency multiplier $FM_1$ are configured to receive the ADC clock signal, and
   wherein each T/H clock input node of the conversion stages $R_{(M-A)}$ is coupled to the respective output node of the frequency multiplier $FM_A$, where A=1 to (M−1).

3. The receiver of claim 2, wherein the value P=2 and where M=4.

4. The receiver of claim 1, wherein each of the bandpass filters is a programmable bandpass filter.

5. The receiver of claim 1, further comprising:
   a plurality of (M−1) frequency multipliers coupled in series such that an output node of the frequency multiplier $FM_A$, where A=1 to (M−2), is coupled to an input node of the frequency multiplier $FM_{A+1}$, each frequency multiplier configured to multiply an input signal by a value P,
   wherein an input node of the conversion stage $R_1$ and an input node of the frequency multiplier $FM_1$ are configured to receive a master clock signal MC, and
   wherein each T/H clock input node of the conversion stage $R_x$, where x=2 to M, is coupled to the respective output node of the frequency multiplier $FM_A$, where A=1 to (M−1).

6. The receiver of claim 5, wherein the value P=0.5 and where M=4.

7. The receiver of claim 1, wherein each of the conversion stages Rx further comprises:
   a switch setting input node coupled to the respective switch to receive a signal to set a state of the switch to either:
   couple the output node of the T/H circuit to the output node of the conversion stage; or
   couple the input node of the conversion stage directly to the output node of the conversion stage.

8. The receiver of claim 1, wherein no two T/H circuits are configured to run at a same T/H clock signal frequency.

9. The receiver of claim 1, further comprising:
   a local oscillator having an output node coupled to the operating clock node of the ADC and configured to provide the ADC clock signal at a frequency $S_f$,
   wherein each T/H circuit is coupled to the local oscillator output to receive the respective T/H clock input signal at a frequency that is a multiple of the ADC clock frequency $S_f$.

10. The receiver of claim 1, further comprising:
    a local oscillator having an output node coupled to the operating clock node of the ADC and configured to provide the ADC clock signal at a frequency $S_f$; and
    a variable oscillator having an output configured to provide a variable clock signal within a frequency range centered on the frequency $S_f$,
    wherein each T/H circuit is coupled to the output node of the variable oscillator to receive the respective T/H clock input signal at a frequency that is a multiple of the variable clock signal.

11. The receiver of claim 1, further comprising:

a variable oscillator having an output node coupled to the operating clock node of the ADC and configured to provide a variable clock signal within a frequency range centered on a frequency $S_f$, wherein each T/H circuit is coupled to the output node of the variable oscillator to receive the respective T/H clock input signal at a frequency that is a multiple of the variable clock signal.

12. The receiver of claim 1, wherein:

a bandwidth range of the low pass filter does not overlap with the bandwidth range of any bandpass filter in any conversion stage.

13. The receiver of claim 1, wherein:

each respective bandwidth range is bounded by a high value and a low value, wherein the low value of each conversion stage $R_x$, where x=1 to M−1, is greater than the high value of the conversion stage $R_{x+1}$.

14. The receiver of claim 1, wherein:

each respective bandwidth range is bounded by a high value and a low value, wherein the low value of each conversion stage $R_x$, where x=1 to M−1, is equal to the high value of the conversion stage $R_{x+1}$.

15. A method of processing an input signal, comprising:

providing the receiver as recited in claim 1;

configuring the respective bandwidth range of each bandpass filter to the respective range of values that differs from the bandwidth range of the other bandpass filters;

setting the switch of each conversion stage to couple the output node to either one of: 1) the output node of the respective T/H circuit or 2) the respective input node of the conversion stage;

providing the ADC clock signal to the ADC, providing a different frequency T/H clock signal to each conversion stage, wherein each T/H clock signal frequency is set as a function of a frequency of the ADC clock signal;

providing the input signal to the conversion stage $R_1$; and outputting a digital representation of the input signal from the ADC.

16. The method of claim 15, further comprising:

generating each T/H clock signal from the ADC clock signal.

17. The method of claim 16, further comprising:

generating each T/H clock signal by multiplying up the ADC clock signal.

18. The method of claim 15, further comprising:

generating each T/H clock signal and the ADC clock signal from a master clock signal.

19. The method of claim 17, further comprising:

generating each T/H clock signal and the ADC clock signal by dividing down the master clock signal.

\* \* \* \* \*